United States Patent
Adusumilli et al.

(10) Patent No.: US 9,576,957 B2
(45) Date of Patent: Feb. 21, 2017

(54) SELF-ALIGNED SOURCE/DRAIN CONTACTS

(71) Applicant: International Business Machines Corporation, Armonk, NY (US)

(72) Inventors: Praneet Adusumilli, Albany, NY (US);
Emre Alptekin, Fishkill, NY (US);
Kangguo Cheng, Schenectady, NY (US); Balasubramanian Pranatharthiharan, Watervliet, NY (US); Shom S. Ponoth, Los Angeles, CA (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 14/729,766

(22) Filed: Jun. 3, 2015

(65) Prior Publication Data

US 2016/0358916 A1    Dec. 8, 2016

(51) Int. Cl.
*H01L 27/092* (2006.01)
*H01L 21/8238* (2006.01)
*H01L 29/66* (2006.01)

(52) U.S. Cl.
CPC ..... *H01L 27/092* (2013.01); *H01L 21/823814* (2013.01); *H01L 29/665* (2013.01); *H01L 29/66545* (2013.01)

(58) Field of Classification Search
CPC .... H01L 21/311; H01L 21/336; H01L 29/665; H01L 29/66515; H01L 29/66537; H01L 29/66545; H01L 29/66575; H01L 29/66606; H01L 29/6659
See application file for complete search history.

(56) References Cited

U.S. PATENT DOCUMENTS

| 2012/0313153 A1* | 12/2012 | Zhang | H01L 29/1054 257/288 |
| 2013/0065371 A1* | 3/2013 | Wei | H01L 21/76224 438/294 |

* cited by examiner

*Primary Examiner* — Fernando L Toledo
*Assistant Examiner* — Lawrence-Linh T Nguyen
(74) *Attorney, Agent, or Firm* — Matthew C. Zehrer (57) ABSTRACT

A semiconductor substrate includes lower source/drain (S/D) regions. A replacement metal gate (RMG) structure is arranged upon the semiconductor substrate between the lower S/D regions. Raised S/D regions are arranged upon the lower S/D regions adjacent to the RMG structure, respectively. The raised S/D regions may be recessed to form contact trenches. First self-aligned contacts are located upon the raised S/D regions within a first active area and second self-aligned contacts are located upon the recessed raised S/D regions in the second active area. The first and second self-aligned contacts allows for independent reduction of source drain contact resistances. The first self-aligned contacts may be MIS contacts or metal silicide contacts and the second self-aligned contacts may be metal-silicide contacts.

11 Claims, 7 Drawing Sheets

SELF-ALIGNED SOURCE/DRAIN CONTACTS

BACKGROUND

Field of the Invention

The present invention generally relates to integrated circuits, and more particularly to field effect transistors (FET) including self-aligned source/drain contacts.

Background of Invention

A FET includes a source/drain region formed in or upon a wafer and a gate covering a channel region formed in or upon the wafer. A FET may be an nFET or a pFET and may be formed utilizing CMOS (Complementary metal-oxide-semiconductor) fabrication techniques. Further scaling of such CMOS techniques may require independently reducing source/drain contact resistances for nFETs and pFETs.

SUMMARY

According to one embodiment of the present invention, a semiconductor structure fabrication method includes forming first lower source/drain (S/D) regions within or upon a first active area of a semiconductor substrate, forming second lower S/D regions within or upon a second active area of the semiconductor substrate, forming a first replacement metal gate (RMG) structure upon the first active area of the semiconductor substrate between the first lower S/D regions, forming a second RMG structure upon the second active area of the semiconductor substrate between the second lower S/D regions, forming first raised S/D regions upon the first lower S/D regions adjacent to the first RMG structure, forming second raised S/D regions upon the second lower S/D regions adjacent to the RMG structure, forming first self-aligned contacts upon the first raised S/D regions, capping the first self-aligned contacts, and forming second self-aligned contacts upon the second raised S/D regions.

In another embodiment of the present invention, a semiconductor structure fabrication method includes forming first lower source/drain (S/D) regions within or upon a first active area of a semiconductor substrate, forming second lower S/D regions within or upon a second active area of the semiconductor substrate, forming a first replacement metal gate (RMG) structure upon the semiconductor substrate between the first lower S/D regions, forming a second RMG structure upon the semiconductor substrate between the second lower S/D regions, forming first raised S/D regions upon the first lower S/D regions adjacent to the first RMG structure, forming second raised S/D regions upon the second lower S/D regions adjacent to the second RMG structure, recessing the first raised S/D regions forming first area contact trenches, capping the first area contact trenches, recessing the second raised S/D regions forming second area contact trenches, forming second self-aligned contacts upon the second recessed raised S/D regions within the second area contact trenches, capping the second self-aligned contacts, and forming first self-aligned contacts upon the first recessed raised S/D regions.

In yet another embodiment of the present invention, a semiconductor structure includes a semiconductor substrate comprising first lower source/drain (S/D) regions and second lower S/D regions, a first replacement metal gate (RMG) structure upon the semiconductor substrate between the first lower S/D regions, a second RMG structure upon the semiconductor substrate between the second lower S/D regions, first raised S/D regions upon the first lower S/D regions adjacent to the first RMG structure, second raised S/D regions upon the second lower S/D regions adjacent to the second RMG structure, first area contact trenches within the first raised S/D regions, second area contact trenches within the second raised S/D regions, first self-aligned contacts within the first area contact trenches, and second self-aligned contacts within the second area contact trenches.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIG. 1-FIG. 8 illustrates a semiconductor structure at intermediate fabrication stages, according to exemplary embodiments of the present invention.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The invention relates to the fabrication of FET devices (planar FETs, FinFETs, etc.) and more particularly, to independently reducing source/drain contact resistances for nFETs and pFETs. Typical integrated circuits may be divided into active areas and non-active areas. The active areas may include FET devices. Each active area may have a different pattern density, or a different number of FinFET devices.

It should be noted that FIG. 1-FIG. 8 represent cross section views of a semiconductor structure, such as a wafer, IC chip, etc. having a gate 140 formed upon a semiconductor substrate 105. The particular cross section view depicted is the gate 140 cross section view along the length of the source/drain region.

Figure 1:
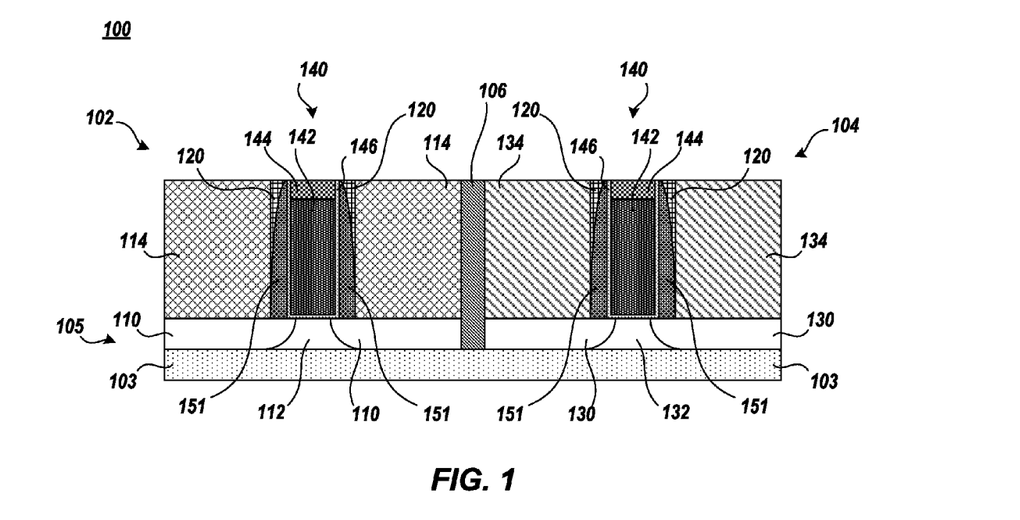

Referring now to FIG. 1, an exemplary semiconductor structure 100, such as a wafer, IC chip, etc. includes active areas, denoted as nFET 102 and a pFET 104, formed upon a semiconductor substrate 105. The active areas may be electrically isolated by insulator 106 as is known in the art.

Semiconductor substrate 105 includes a base substrate 103. Within nFET 102 areas, substrate 105 further includes lower source/drain regions 110 and channel region 112. Within pFET 104 areas, substrate 105 further includes lower source/drain regions 130 and channel region 132. When nFET 102 and pFET 104 are embodied as planar FETs, the source/drain and channel may be formed by implanting appropriate ions within base substrate 103 in source/drain locations leaving the channel region 112 undoped. When nFET 102 and pFET 104 are embodied as FinFETs, a semiconductor fin is formed upon a buried dielectric layer (not shown) within substrate base 103. The portion of the fin under the gate forms the channel and the portions of the fin extending outwardly form the gate are implanted with appropriate ions and form the source/drain. Such techniques are known in the art and, as such, and for clarity, semiconductor substrate 105 may be referred to generically and may include such planar FET configurations, FinFET configurations, etc.

In FinFET configurations, the base substrate 103 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 103 may be about, but is not limited to, several hundred microns thick. For example, the base substrate 103 may have a thickness ranging from 0.5 mm to about 1.5 mm.

In FinFET configurations, the buried dielectric layer may be formed upon the base substrate 103 and may include any of several dielectric materials, for example, oxides, nitrides and oxynitrides of silicon. The buried dielectric layer may also include oxides, nitrides and oxynitrides of elements other than silicon. In addition, the buried dielectric layer may include crystalline or non-crystalline dielectric material. Moreover, the buried dielectric layer may be formed using any of several known methods, for example, thermal or plasma oxidation or nitridation methods, chemical vapor deposition methods, and physical vapor deposition methods. The buried dielectric layer may have a thickness ranging from about 5 nm to about 200 nm. In one embodiment, the buried dielectric layer may have a thickness ranging from about 150 nm to about 180 nm.

In FinFET configurations, a SOI layer may be formed upon the buried dielectric layer any of the several semiconductor materials included in the base substrate 103. In general, the base substrate 103 and the SOI layer may include either identical or different semiconducting materials with respect to chemical composition, dopant concentration and crystallographic orientation. In one particular embodiment of the present invention, the base substrate 103 and the SOI layer include semiconducting materials that include at least different crystallographic orientations. Typically the base substrate 103 or the SOI layer include a {110} crystallographic orientation and the other of the base substrate 103 or the SOI layer includes a {100} crystallographic orientation. Typically, the SOI layer may include a thickness ranging from about 5 nm to about 100 nm. In one embodiment, the SOI layer may have a thickness ranging from about 25 nm to about 30 nm. Methods for forming the SOI layer are well known in the art. Non-limiting examples include SIMOX (Separation by Implantation of Oxygen), wafer bonding, and ELTRAN® (Epitaxial Layer TRANsfer). It may be understood by a person having ordinary skill in the art that a plurality of fins may be etched from the SOI layer. Because the plurality of fins may be etched from the SOI layer, they too may include any of the characteristics listed above for the SOI layer.

The embodiments may be implemented in a gate first or a gate last FET fabrication process flow, however a gate last, or replacement gate (RG), process flow will be relied upon for the detailed description below.

In a general RG process flow, a sacrificial gate structure (not shown) is formed upon substrate 105. For example, in FinFET configurations, the sacrificial gate structure may be pattered and etched from a blanket layer of polysilicon deposited upon the base substrate 103 and upon and surrounding the fins. A pair of spacers 151 are deposited on opposite sidewalls of the sacrificial gate structure.

At this fabrication stage of the general RG process flow, an upper nFET source drain 114 and an upper pFET source drain 134 may be formed adjacent to sacrificial gate structure, respectively. Upper nFET source drain 114 is generally a deposited n-type material and in particular embodiments may be an n-type epitaxially grown material. Likewise, upper pFET source drain 134 is generally a deposited n-type material and in particular embodiments may be an n-type epitaxially grown material.

Generally, expitaxial growth, grown, deposition, formation, etc. means the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal planar boundary will take on a <100> orientation.

Examples of various epitaxial growth process apparatuses that are suitable for use in forming epitaxial semiconductor material of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the carbon doped epitaxial semiconductor material typically ranges from 550° C. to 900° C. Although higher temperature typically results in faster deposition, the faster deposition may result in crystal defects, film cracking, etc.

Upper nFET source drain 114 is formed upon, around, etc. the lower source/drain regions 110. Likewise, the upper pFET source drain 134 is formed upon, around, etc. the lower source/drain regions 130. Upper nFET source drain 114 and upper pFET source drain 134 may be formed to enlarge the source and drain, respectively, of semiconductor structure 100.

Various seed surfaces of structure 100 may be utilized to epitaxially grow upper nFET source drain 114 and upper pFET source drain 134. For example, {100} surfaces of the substrate 105 may be utilized as seed surfaces for epitaxial growth. Further, {110} fin sidewall surfaces as well as the {100} fin top surface may be utilized as seed surfaces for epitaxial growth. During upper nFET source drain 114 and upper pFET source drain 134 formation, diamond-shaped, v-shaped {111} boundaries may exist within the respective epitaxial material of upper nFET source drain 114 and upper pFET source drain 134.

Such {111} boundaries may be crystal defects generally result from the misalignment of lattice planes of adjacent epitaxial growth structures as well as the different epitaxial growth properties. Overgrowth of epitaxial material above such crystal defects may continue such that the upper nFET source drain 114 and upper pFET source drain 134 are formed to a thickness coplanar with or above the height of the sacrificial gate structure.

A non-limiting list of exemplary expitaxial materials are: silicon germanium alloy (SiGe), Silicon (Si), in-situ boron doped SiGe or Si, in situ phosphorus or arsenic doped Si or SiGe, with doping levels ranging from, e.g., $1E19/cm^3$ to $5E21/cm^3$. To employ the process described above in the fabrication of pFET 104, boron-doped Si or SiGe may be employed in one or more embodiments for growth of upper pFET source drain 134. To fabricate nFET 102, phosphorus-doped Si or Si:C may be employed in one or more embodiments for growth of the upper nFET source drain 114. The doping can be chosen as desired for particular transistor applications during the formation of upper nFET source drain 114 and upper pFET source drain 134 as is known in so called in-situ doping techniques.

In continuing the general RG process flow, an interlayer dielectric (ILD) material 120 is deposited surrounding the upper nFET source drain 114 and an upper pFET source drain 134 and upon the sacrificial gate structures and ILD 120 overburden removed, as is known in the art.

Next, the sacrificial gate structure may be removed from between the pair of spacers 151, as by, for example, an anisotropic vertical etch process such as a reactive ion etch (RIE). This creates a gate trench between the spacers where a replacement metal gate (RMG) structure 140 may then be formed. The RMG structure 140 may include a high-k dielectric liner 146, metal gate 142, gate cap 144, and/or spacers 151.

The high-k dielectric liner 146 may be deposited within the gate trench. The high-k dielectric liner 146 is a dielectric material having a greater dielectric constant as compared to silicon dioxide. Moreover, the high-k dielectric liner 146 may be formed using any of several known methods, for example, thermal or plasma oxidation or nitridation methods, chemical vapor deposition methods, and physical vapor deposition methods. The buried dielectric layer may have a thickness ranging from about 1.5 nm to about 5 nm.

The metal gate 142 may be deposited upon the high-k dielectric liner 146 within the gate trench. The metal gate 142 may be formed by a metal deposition process, which results in metal 140 being deposited within the trench and on top of the high-k dielectric layer 146. In order to provide a suitable work function, the metal material should be matched to the type of device the transistor will form. For example, if the semiconductor device is an nFET 102, suitable refractory metals include tantalum or tantalum nitride. If a semiconductor device is to be a pFET 104, ruthenium or rhenium are suitable metals. The metal gate 142 may be deposited to a thickness to fill the trench and recessed below the top surfaces of the upper source drain 114, 134, respectively. A gate cap 144 (e.g., nitride, etc.) may be deposited upon the metal gate 142 within the gate trench. Any suitable deposition technique can be used to deposit the metal gate 142 and gate cap 144, including but not limited to atomic layer deposition, chemical vapor deposition, physical vapor deposition, sputtering, plating, etc.

A chemical mechanical polish (CMP) technique may be performed to generally planarize the upper surface of structure 100 such that respective top surfaces of upper nFET source drain 114, upper pFET source drain 134, ILD 120, RMG 140, etc. are coplanar.

Figure 2:
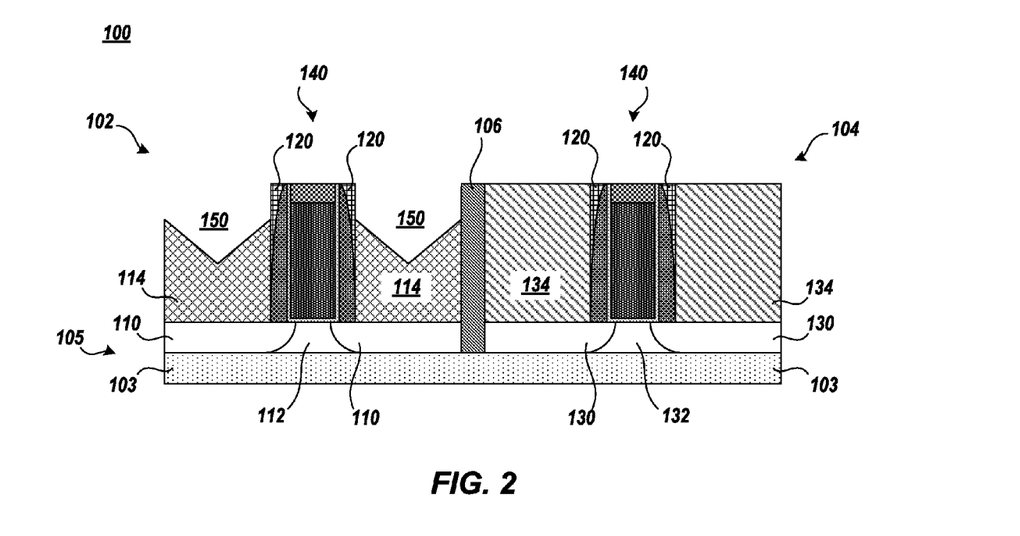

Referring now to FIG. 2, depicting semiconductor structure 100 at an intermediate fabrication stage. At this fabrication stage, upper nFET source drain 114 are recessed by a self-aligned and selective removal technique (e.g., wet etch, dry etch, etc.). Various etchants, such as ammonia, are known to remove n-type materials.

The recess of upper nFET source drain 114 form trenches 150 within upper nFET source drain 114. The recessing of upper nFET source drain 114 is selective to other structure 100 materials such that the material of upper nFET source drain 114 is removed whilst the other materials of structure 100 are retained. For example the materials of ILD 120, RMG 140, pFET source drain 134, etc. are retained. The recessing of nFET source drain 114 is timed such that only a portion of the nFET source drain 114 is removed thereby leaving a portion nFET source drain 114 generally upon the lower source/drain region 110. Further, trenches 150 are self-aligned, the selective formation of which is accomplished by a mask-free upper nFET source drain 114 recess process.

The recessing procedures that form recess trenches 150 may be chosen to obtain a depth and side profile according to design purposes. For instance, trenches 150 can be formed by a directional dry etch which can form substantially straight sidewalls or by a wet (or other isotropic) etch process which can form angled sidewalls, undercuts, etc. Such angled sidewalls may be beneficial to increase the area of the top surfaces of upper nFET source drain 114. If the material of upper nFET source drain 114 is epitaxially grown, the trenches 150 may be formed utilizing the {111} crystal defects as a self-limiting etch stop, such that the lower surfaces of trenches 150 may be angled to generally form a 'v'. In one embodiment, the nFET source drain 114 includes phosphorus doped Si and is recessed by an aqueous etchant containing tetramethylammonium hydroxide (TMAH).

Figure 3:
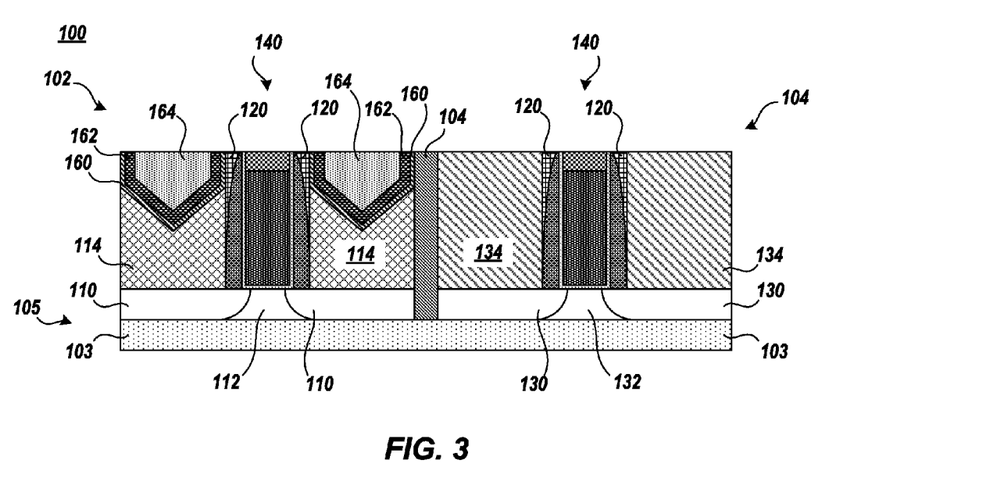

Referring now to FIG. 3, depicting semiconductor structure 100 at an intermediate fabrication stage. At this fabrication stage, nFET source/drain contacts 162 are formed upon upper nFET source drain 114 and subsequently capped by cap 164.

Prior to forming nFET source/drain contacts 162, an ultra-thin (e.g., 5A, etc.) dielectric 160 may be deposited upon structure 100. Ultra-thin dielectric 160 may be a dielectric material may include any of several dielectric materials, for example, oxides, nitrides and oxynitrides of silicon. The ultra-thin dielectric 160 may also include oxides, nitrides and oxynitrides of elements other than silicon. For example, ultra-thin dielectric 160 may be $ZrO_2$, etc. In addition, the ultra-thin dielectric 160 may include crystalline or non-crystalline dielectric material. Moreover, the buried dielectric layer may be formed using any of several known methods, for example, thermal or plasma oxidation or nitridation methods, chemical vapor deposition methods, and physical vapor deposition methods, such as $ZrO_2$, etc.

Source/drain contacts 162 may be deposited upon structure 100. Source/drain contacts 162 may be an n-type metal. Source/drain contacts 162 may be formed by a metal deposition process, which results in metal being deposited within trench 150 and on top of the ultra-thin dielectric 160. In order to provide a suitable work function, the metal material should be matched to the type of device the transistor will form. For example, if the semiconductor device is an nFET 102, suitable refractory metals include tantalum, tantalum nitride, titanium carbide. Generally, source/drain contacts 162 may be conduction band edge metals, metal silicide, etc.

Ultra-thin dielectric 160 may be deposited as a blanket layer upon structure 100. For example, the ultra-thin dielectric 160 may be formed within trenches 150, upon ILD 120, and upon RMG 140 within nFET 102, and may be formed upon pFET source drain 134, upon ILD 120, and upon RMG 140 within pFET 104. Likewise, source/drain contacts 162 may be formed as a deposited blanket layer upon ultra-thin dielectric 160. The layer of source/drain contacts 162 material may have a thickness ranging from about 2 nm to about 10 nm.

A dielectric cap 164 may be deposited upon the source/drain contacts 162 within trenches 150. Dielectric cap 164 may be a dielectric material may include any of several dielectric materials, for example, oxides, nitrides and oxynitrides of silicon. The dielectric cap 164 may also include oxides, nitrides and oxynitrides of elements other than silicon. For example, dielectric cap 164 may be a high density plasma (HDP) oxide.

Subsequently, a CMP technique may be performed stopping at the upper surface of pFET source drain 134 to remove overburden ultra-thin dielectric 160 material, source/drain contact 162 material, and dielectric cap 164 material. The CMP process generally removes these materials from pFET 104 and leaves ultra-thin dielectric 160 material, source/drain contact 162 material, and dielectric cap 164 material within the trenches 150 of nFET 102, as is shown in FIG. 3. The combination of ultra-thin dielectric 160 material and source/drain contact 162 material may be referred to as a metal insulator semiconductor contact (MIS).

Figure 4A:
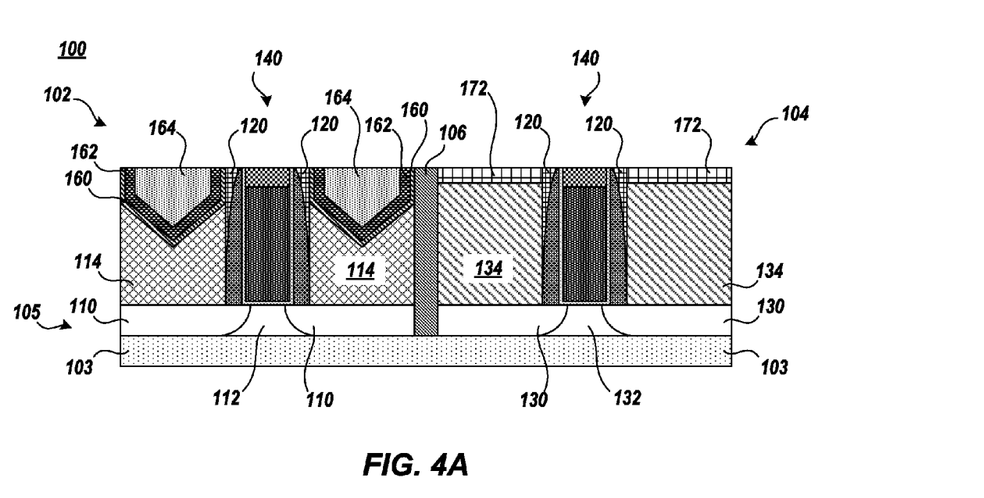
Figure 4B:
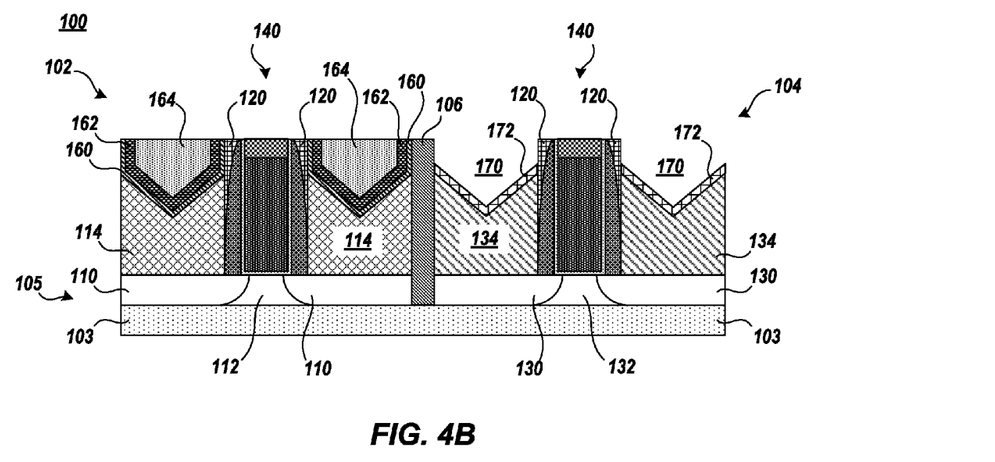

Referring now to FIG. 4A and FIG. 4B depicting semiconductor structure 100 at an intermediate fabrication stage. At this fabrication stage, pFET source/drain contacts 172 are formed upon upper pFET source drain 134.

Prior to pFET source/drain contact 172 formation, the upper pFET source drain 134 may be recessed by a self-aligned and selective removal technique (e.g., wet etch, dry etch, etc.). Various etchants, such as an Ethylenediamine pyrocatechol, are known to remove p-type materials. The recess of upper pFET source drain 134 may form trenches 170 within upper pFET source drain 134. The recessing of upper pFET source drain 134 is selective to other structure 100 materials such that the material of upper pFET source drain 134 is removed whilst the other materials of structure 100 are retained. For example the materials of ILD 120, RMG 140, nFET source drain 114, dielectric cap 164, etc. are retained. The recessing of pFET source drain 134 is timed such that only a portion of the pFET source drain 134 is removed thereby leaving a portion pFET source drain 134 generally upon the lower source/drain region 130. Further, trenches 170 are self-aligned, the selective formation of which is accomplished by a mask-free upper pFET source drain 134 recess process.

The recessing procedures that form recess trenches 170 may be chosen to obtain a depth and side profile according to design purposes. For instance, trenches 170 can be formed by a directional dry etch which can form substantially straight sidewalls (i.e., resulting in a straight pFET source/drain contact 172, as shown in FIG. 4A) or by a wet (or other isotropic) etch process which can form angled sidewalls, undercuts, etc. (i.e., resulting in a v pFET source/drain contact 172, as shown in FIG. 4B). Such angled sidewalls may be beneficial to increase the area of the top surfaces of upper pFET source drain 134. If the material of upper pFET source drain 134 is epitaxially grown, the trenches 170 may be formed utilizing the {111} crystal defects as a self-limiting etch stop, such that the lower surfaces of trenches 170 may be angled to generally form a 'v'.

pFET source/drain contacts 172 may be a metal salicide, such as a valence band edge metal silicide (e.g., nickel, platinum silicide), etc. A salicide formation process may include the formation of a thin metal film upon the upper pFET source drain 134, ultimately forming a metal silicide contact through a series of annealing and/or etch processes. The term salicide is a compaction of the phrase self-aligned silicide. The description self-aligned indicates that the pFET source/drain contacts 172 do not require a mask during formation. During the annealing and/or etch processes, the transition metal reacts with upper pFET source drain 134 forming a low-resistance transition metal silicide (e.g., nickel silicide, platinum nickel silicide, etc.). Following pFET source/drain contacts 172 formation, any overburden transition metal may be removed by etching, CMP, etc. leaving silicide contacts upon pFET source drain 134.

For clarity, though FIG. 4A or FIG. 4B depict a last intermediate fabrication stage, structure 100 may undergo further fabrication stages such as, further FEOL stages, further BEOL, stages, etc. for form a semiconductor structure such as wafer, IC chip.

Figure 5:
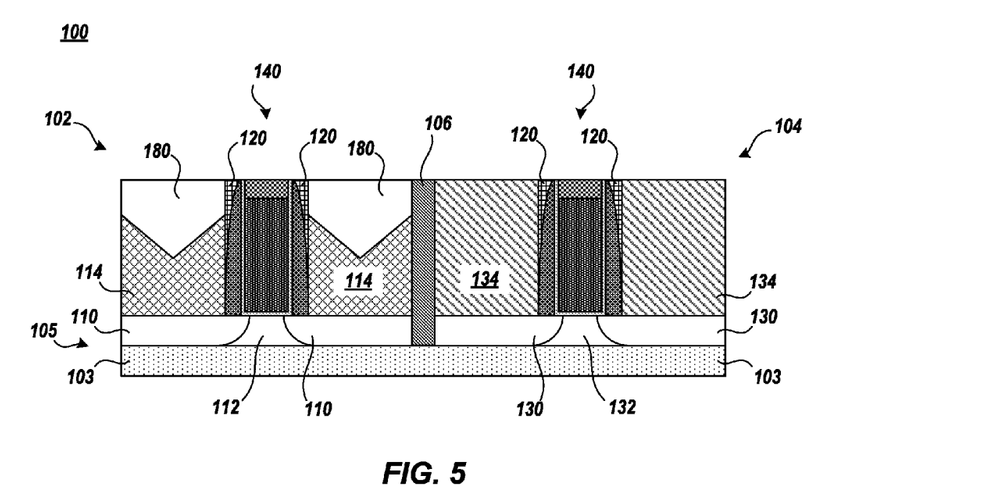

Referring now to FIG. 5 depicting an exemplary semiconductor structure 100 at an intermediate fabrication stage subsequent to recessing upper nFET source drain 114 by the self-aligned and selective removal technique to form trenches 150, as depicted in FIG. 2. At the present stage of structure 100 fabrication, trenches 150 are filled with dielectric cap 180.

For clarity, the structure 100 fabrication stages of FIG. 3-FIG. 4A or FIG. 4B depict the structure wherein nFET source drain contacts 162 are first formed and where the nFET source drain contacts 162 are a MIS contacts and the pFET source drain contacts 172 are subsequently formed and are silicide metal contacts. The structure 100 associated with fabrication stages of FIG. 5-FIG. 8 depict the structure 100 wherein pFET source contacts 172 are first formed and are silicide metal and the nFET source drain contacts 162 are subsequently formed and are also silicide metal contacts.

Dielectric cap 180 may be deposited upon upper nFET source drain 114 within trenches 150. Dielectric cap 164 may be a dielectric material may include any of several dielectric materials, for example, amorphous carbon formed by, thermal or plasma oxidation or nitridation methods, chemical vapor deposition methods, and physical vapor deposition methods.

Figure 6:
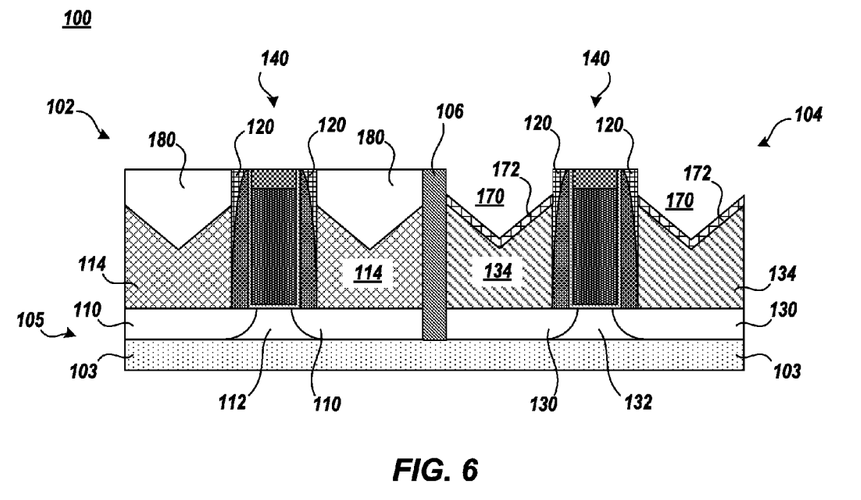

Referring now to FIG. 6 depicting semiconductor structure 100 at an intermediate fabrication stage. At this fabrication stage, upper pFET source drain 134 is recessed and pFET source/drain contacts 172 are formed thereupon. Trenches 170 may be formed within upper pFET source drain 134 and pFET source/drain contacts 172 may be formed utilizing similar fabrication techniques as described with respect to FIG. 4A and/or FIG. 4B.

Figure 7:
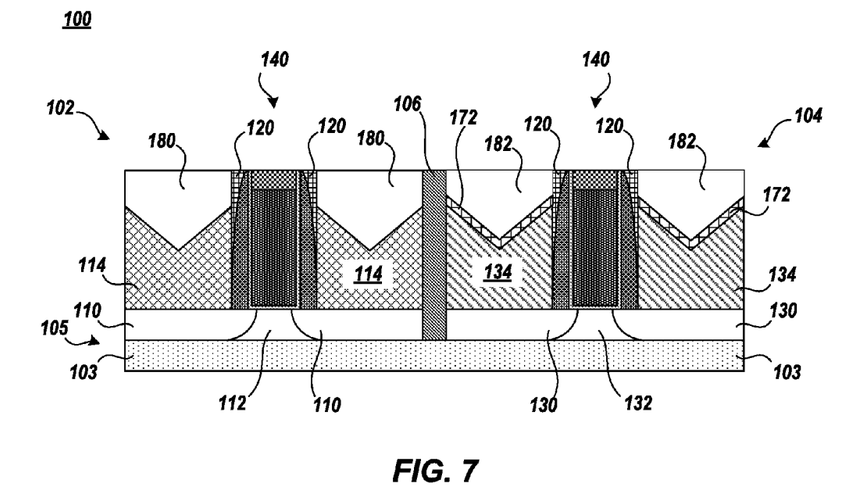

Referring to FIG. 7, depicting semiconductor structure 100 at an intermediate fabrication stage. At this fabrication stage, dielectric cap 182 is formed upon the pFET source/drain contacts 172 within the remaining trench 170. The dielectric cap 182 may be deposited upon pFET source/drain contacts 172 within trenches 170. Dielectric cap 182 may be a dielectric material may include any of several dielectric materials, for example, oxides, nitrides and oxynitrides of silicon. The dielectric cap 182 may also include oxides, nitrides and oxynitrides of elements other than silicon. For example, dielectric cap 182 may be an HDP oxide.

Figure 8:
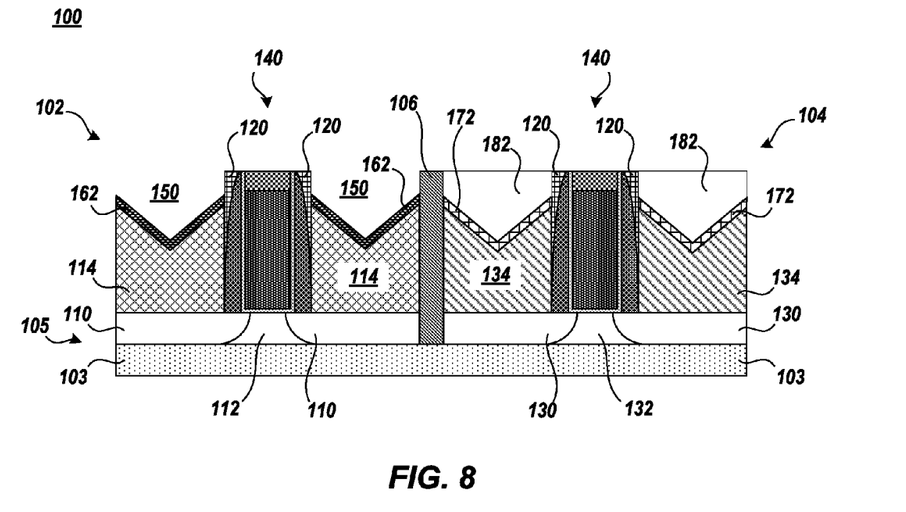

Referring to FIG. 8, depicting semiconductor structure 100 at an intermediate fabrication stage. At this fabrication stage, dielectric cap 180 is removed from trenches 150 and nFET source/drain contacts 162 are formed upon upper nFET source drain 114. The dielectric cap 180 may be removed by selectively etching the material of cap 180 while retaining the materials of pFET 104. For example, an amorphous carbon etchant may be utilized to remove the dielectric cap 180 while the dielectric cap 182, the IDL 120, and the RMG 140 of structure 100 is retained. The upper surface of upper nFET source drain 114 may be utilized as an etch stop.

nFET source/drain contacts 162 may be a metal silicide, such as a conduction band edge metal silicide (e.g., titanium silicide). A salicide formation process may include the formation of a thin metal film upon the upper nFET source drain 114, ultimately forming a metal silicide contact through a series of annealing and/or etch processes. nFET source/drain contacts 162 may be self-aligned such that they do not require a mask during formation. During the annealing and/or etch processes, the transition metal reacts with upper nFET source drain 114 forming a low-resistance transition metal silicide. Following nFET source/drain contacts 162 formation, any overburden transition metal may be removed by etching, CMP, etc. leaving silicide contacts upon nFET source drain 114.

For clarity, though FIG. 8 depicts a last intermediate fabrication stage, structure 100 may undergo further fabrication stages such as, further FEOL stages, further BEOL, stages, etc. for form a semiconductor structure such as wafer, IC chip.

Figure 9:
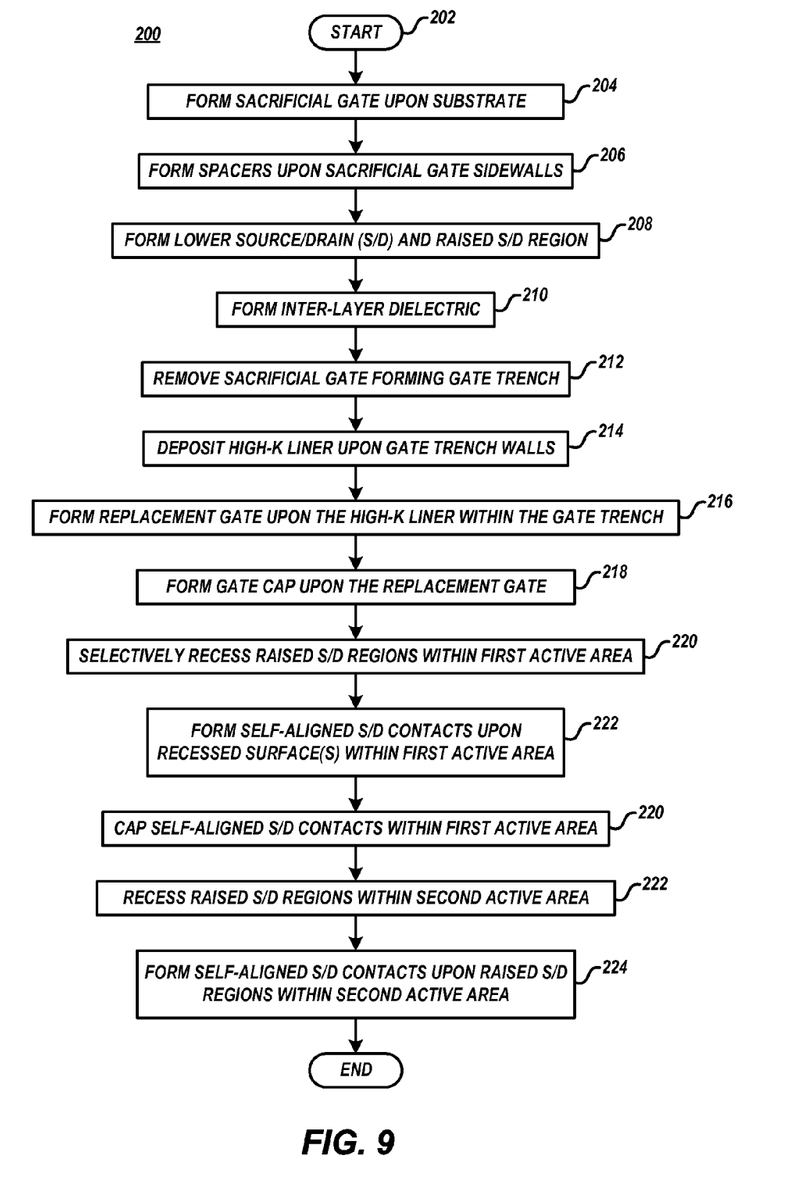
FIG. 9-FIG. 10 illustrates semiconductor structure fabrication methods, according to exemplary embodiments of the present invention.

Referring to FIG. 9, depicting semiconductor structure fabrication method 200. Method 200 may be exemplarily utilized to fabricate a semiconductor structure 100 including nFET source drain contacts 162 being first formed and where the nFET source drain contacts 162 are a MIS contacts and wherein pFET source drain contacts 172 are subsequently formed and are p-type silicide metal contacts. Method 200 generally allows for the independent reduction of source drain contact resistance of source drain contacts in a first active are and source drain contacts in a second active area.

Method 200 begins at block 202 and continues with forming a sacrificial gate structure upon a semiconductor substrate. For example, a sacrificial gate structure may be formed upon substrate 105. Method 200 may continue with forming spacers upon opposite sidewalls of the sacrificial gate structure. For example, spacers 151 are formed upon the sacrificial gate structure sidewalls and upon the substrate 105.

Method 200 may continue with forming lower source/drain regions and raised source/drain regions (block 208). Lower source/drain regions may be formed by implanting appropriate ions within substrate 105 adjacent to the sacrificial gate structure. Lower source drain regions may be formed by initially forming a fin upon the substrate 105 prior to forming the sacrificial gate structure. Subsequent to forming the sacrificial gate structure upon the substrate 105 and upon the fin, the portion of the fin extending outwardly from the sacrificial gate structure may be implanted with appropriate ions.

Method 200 may continue with forming an inter-layer dielectric (block 210). For example, ILD 120 may be deposited as a blanket layer upon substrate 105, upon the sacrificial gate structure, and/or upon the raised source drain regions, etc. to a thickness greater than the height of the sacrificial gate structure. Overburden ILD 120 material may be removed in a subsequent CMP process to planarize the semiconductor structure 100.

Method 200 may continue with forming the sacrificial gate structure forming a gate trench between the spacers (block 212). For example, a gate trench may be formed by removing the sacrificial gate structure between spacers 151. The gate trench may further expose the underlying substrate 105.

Method 200 may continue with forming a high-k liner upon the gate trench walls (block 214). For example, a high-k dielectric liner 146 may be deposited upon the inner spacer sidewalls and may be deposited upon the substrate 105 within the gate trench. Method 200 may continue with forming a replacement gate structure upon the high-k liner within the gate trench (block 216). For example, metal gate 142 may be deposited upon the high-k dielectric liner 146 within the gate trench. Method 200 may continue with forming a gate cap upon the replacement gate structure (block 218). For example, the metal gate 142 may be recessed within the gate trench and gate cap 144 may be deposited upon the recessed metal gate 142 within the gate trench.

Method 200 may continue with selectively recessing the raised source drain regions within a first semiconductor structure 100 active area (block 220). For example, upper nFET source drain 114 or upper pFET source drain 134 may be recessed forming an S/D trench. The S/D trench may have angled walls or straight walls. The recessing of either upper nFET source drain 114 or an upper pFET source drain 134 is selective such that the material of the first raised source drain region may be recessed whilst the material of the second raised source drain is not removed.

Method 200 may continue with forming self-aligned source drain contacts upon the recessed raised source drain regions within the first active area (block 222). For example, a MIS contact may be formed upon the recessed raised source drain regions within the first active area. The MIS materials may be blanket deposited upon structure 100 and overburden MIS materials may be removed leaving the MIS contact within the S/D trench.

Method 200 may continue with capping the self-aligned source drain contacts upon the recessed raised source drain regions within the first active area (block 224). For example, the MIS contact formed within the S/D trench may be capped by depositing a dielectric material upon the MIS contact within the S/D trench forming dielectric cap 164. The dielectric cap 164 material may be deposited as a blanket layer upon structure 100 and overburden material may be removed from structure 100 leaving the dielectric cap 164 within the S/D trench.

Method 200 may continue with selectively recessing the raised source drain regions within a second semiconductor structure 100 active area (block 226). For example, the other of the upper nFET source drain 114 or the upper pFET source drain 134 may be recessed forming a second S/D trench. The second S/D trench may have angled walls or straight walls. The recessing of the other of the upper nFET source drain 114 or an upper pFET source drain 134 is selective such that the material of the second raised source drain region may be recessed whilst the materials of the second active area is not removed.

Method 200 may continue with forming self-aligned source drain contacts upon the source drain regions within the second active area (block 228). For clarity, in an embodiment where the source drain regions in the second active area are not recessed, the self-aligned source drain contacts may be formed upon the un-recessed source drain regions in the second active area. In an embodiment, where the source drain regions in the second active area are recessed, the self-aligned source drain contacts may be formed upon the recessed source drain regions within the second S/D trench in the second active area. A salicide metal contact may be formed upon the raised source drain regions within the second active area. Method 200 ends at block 230.

Figure 10:
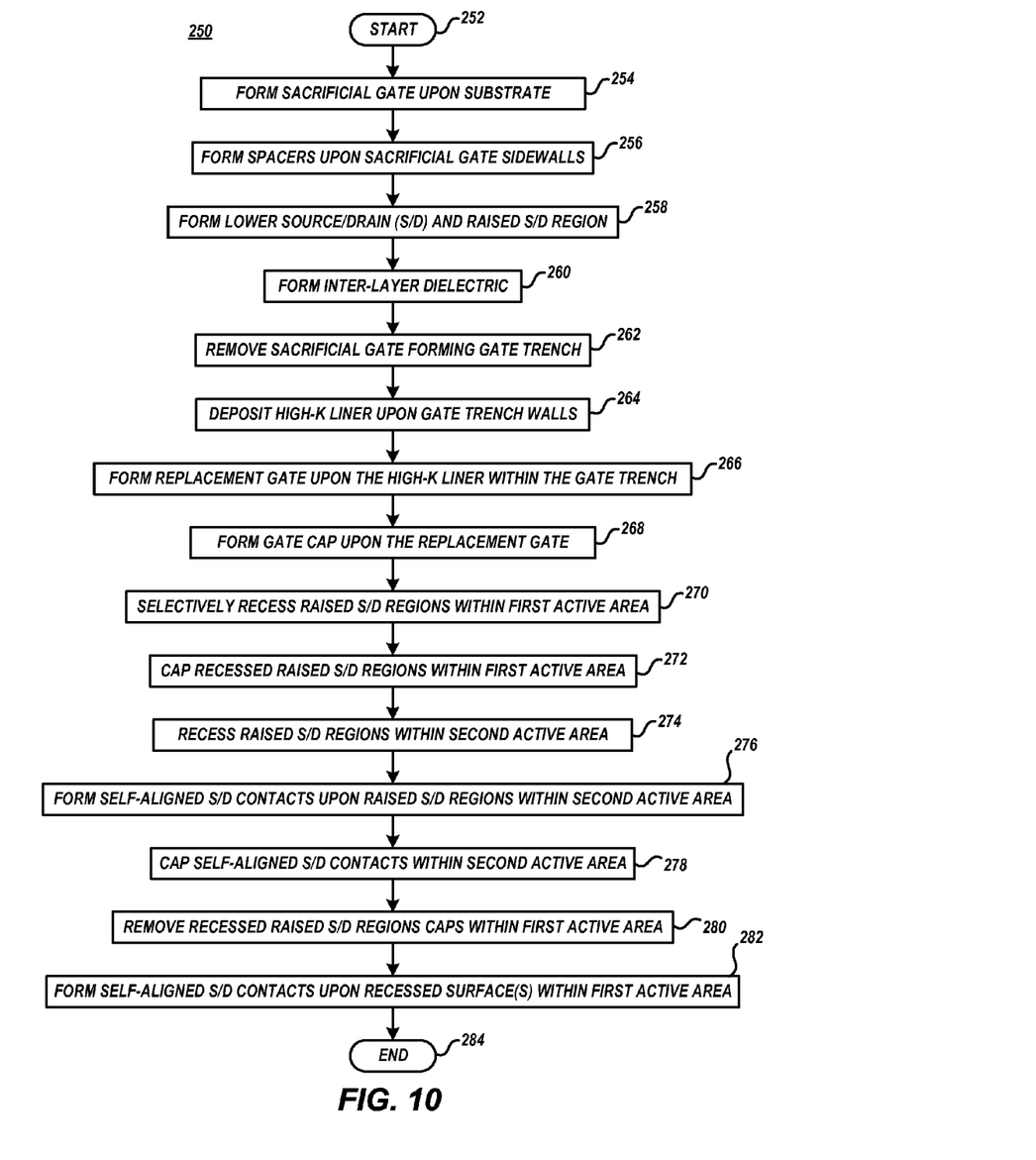

Referring to FIG. 10, depicting semiconductor structure fabrication method 250. Method 250 may be exemplarily utilized to fabricate a semiconductor structure 100 including pFET source drain contacts 172 being first formed and where the pFET source drain contacts 172 are p-type silicide metal contacts and wherein nFET source drain contacts 162 are subsequently formed and are n-type silicide metal contacts. Method 250 generally allows for the independent reduction of source drain contact resistance of source drain contacts in a first active are and source drain contacts in a second active area.

Method 250 begins at block 252 and continues with forming a sacrificial gate structure upon a semiconductor substrate (block 254). For example, a sacrificial gate structure may be formed upon substrate 105. Method 250 may continue with forming spacers upon opposite sidewalls of the sacrificial gate structure (block 256). For example, spacers 151 are formed upon the sacrificial gate structure sidewalls and upon the substrate 105.

Method 250 may continue with forming lower source/drain regions and raised source/drain regions (block 258). Lower source/drain regions may be formed by implanting appropriate ions within substrate 105 adjacent to the sacrificial gate structure. Lower source drain regions may be formed by initially forming a fin upon the substrate 105 prior to forming the sacrificial gate structure. Subsequent to forming the sacrificial gate structure upon the substrate 105 and upon the fin, the portion of the fin extending outwardly from the sacrificial gate structure may be implanted with appropriate ions.

Method 250 may continue with forming an inter-layer dielectric (block 260). For example, ILD 120 may be deposited as a blanket layer upon substrate 105, upon the sacrificial gate structure, and/or upon the raised source drain regions, etc. to a thickness greater than the height of the sacrificial gate structure. Overburden ILD 120 material may be removed in a subsequent CMP process to planarize the semiconductor structure 100.

Method 250 may continue with forming the sacrificial gate structure forming a gate trench between the spacers (block 262). For example, a gate trench may be formed by removing the sacrificial gate structure between spacers 151. The gate trench may further expose the underlying substrate 105.

Method 250 may continue with forming a high-k liner upon the gate trench walls (block 264). For example, a high-k dielectric liner 146 may be deposited upon the inner spacer sidewalls and may be deposited upon the substrate 105 within the gate trench. Method 250 may continue with forming a replacement gate structure upon the high-k liner within the gate trench (block 266). For example, metal gate 142 may be deposited upon the high-k dielectric liner 146 within the gate trench. Method 250 may continue with forming a gate cap upon the replacement gate structure (block 268). For example, the metal gate 142 may be recessed within the gate trench and gate cap 144 may be deposited upon the recessed metal gate 142 within the gate trench.

Method 250 may continue with selectively recessing the raised source drain regions within a first semiconductor structure 100 active area (block 270). For example, upper nFET source drain 114 or upper pFET source drain 134 may be recessed forming an S/D trench. The S/D trench may have angled walls or straight walls. The recessing of either upper nFET source drain 114 or an upper pFET source drain 134 is selective such that the material of the first raised source drain region may be recessed whilst the material of the second raised source drain is not removed.

Method 250 may continue with capping the S/D trench within the recessed raised source drain regions within the first active area (block 272). For example, the S/D trench may be capped by depositing a dielectric material within the S/D trench forming dielectric cap 180. The dielectric cap 180 material may be deposited as a blanket layer upon structure 100 and overburden material may be removed from structure 100 leaving the dielectric cap 180 within the S/D trench.

Method 250 may continue with selectively recessing the raised source drain regions within a second semiconductor structure 100 active area (block 274). For example, the other of the upper nFET source drain 114 or the upper pFET source drain 134 may be recessed forming a second S/D trench. The second S/D trench may have angled walls or straight walls. The recessing of the other of the upper nFET source drain 114 or an upper pFET source drain 134 is selective such that the material of the second raised source drain region may be recessed whilst the materials of the second active area is not removed.

Method 250 may continue with forming self-aligned source drain contacts upon the source drain regions within the second active area (block 276). For clarity, in an embodiment where the source drain regions in the second active area are not recessed, the self-aligned source drain contacts may be formed upon the un-recessed source drain regions in the second active area. In an embodiment, where the source drain regions in the second active area are recessed, the self-aligned source drain contacts may be formed upon the recessed source drain regions within the second S/D trench in the second active area. A salicide metal contact may be formed upon the raised source drain regions within the second active area.

Method 250 may continue with capping the source drain contacts within the second active area (block 278). For example, source drain contacts may be capped by depositing a dielectric material forming dielectric cap 182. The dielectric cap 182 material may be deposited as a blanket layer upon structure 100 and overburden material may be removed from structure 100 leaving the dielectric cap 182 upon the source drain contacts within the second active area.

Method 250 may continue with removing the source drain region caps within the first active area (block 280). For example, the S/D trench may be exposed by removing the dielectric cap 180 within the S/D trench. The removal of the caps 180 may be selective such that the caps 180 are removed and the other materials of structure 100 are retained.

Method 250 may continue with forming self-aligned source drain contacts upon the recessed raised source drain regions within the first active area (block 282). For clarity, in an embodiment where the source drain regions in the first active area are not recessed, the self-aligned source drain contacts may be formed upon the un-recessed source drain regions in the first active area. In an embodiment, where the source drain regions in the first active area are recessed, the self-aligned source drain contacts may be formed upon the recessed source drain regions within the S/D trenches in the first active area. A salicide metal contact may be formed upon the raised source drain regions within the first active area. Method 250 ends at block 284.

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof. It should also be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The methods as discussed above may be used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

Unless described otherwise, or in addition to that described herein, "forming," "depositing," "deposited," etc. may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation.

References herein to terms such as "vertical", "horizontal", etc. are made by way of example, and not by way of limitation, to establish a frame of reference. The term "horizontal" as used herein is defined as a plane parallel to the conventional plane or surface of the substrate 15, regardless of the actual spatial orientation of the semiconductor substrate 15. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

What is claimed is:

1. A semiconductor structure fabrication method comprising:
    forming first lower source/drain (S/D) regions within or upon a first active area of a semiconductor substrate;
    forming second lower S/D regions within or upon a second active area of the semiconductor substrate;
    forming a first replacement metal gate (RMG) structure upon the first active area of the semiconductor substrate between the first lower S/D regions;
    forming a second RMG structure upon the second active area of the semiconductor substrate between the second lower S/D regions;
    forming first raised S/D regions upon the first lower S/D regions adjacent to the first RMG structure;
    forming second raised S/D regions upon the second lower S/D regions adjacent to the RMG structure;
    forming first self-aligned contacts upon the first raised S/D regions;
    capping the first self-aligned contacts, and;
    forming second self-aligned contacts upon the second raised S/D regions.

2. The semiconductor structure fabrication method of claim 1, wherein the first self-aligned contacts are metal-on-insulator (MIS) contacts and wherein the second self-aligned contacts are metal-silicide contacts.

3. The semiconductor structure fabrication method of claim 2, further comprising:
    recessing the first raised S/D regions to form first active area contact trenches.

4. The semiconductor structure fabrication method of claim 3, wherein forming first self-aligned contacts further comprises:
    forming a dielectric liner upon the first raised S/D regions, within the first active area contact trenches, and upon the second raised S/D regions;
    forming a metal layer upon the dielectric liner, and;
    removing dielectric liner and metal layer overburden.

5. The semiconductor structure fabrication method of claim 3, further comprising:
    recessing the second raised S/D regions to form second active area contact trenches.

6. The semiconductor structure fabrication method of claim 5, wherein forming second self-aligned contacts further comprises:
    forming the metal-silicide contacts within the second active area contact trenches.

7. The semiconductor structure fabrication method of claim 1, wherein the first active area of the semiconductor structure is an n-type field-effect-transistor (nFET) area and wherein the second active area of the semiconductor structure is a p-type field-effect-transistor (pFET) area.

8. The semiconductor structure fabrication method of claim 1, wherein the first active area of the semiconductor structure is a p-type field-effect-transistor (pFET) area and wherein the second active area of the semiconductor structure is an n-type field-effect-transistor (nFET) area.

9. The semiconductor structure fabrication method of claim 3, wherein the recessing of the first raised S/D regions is selective to one or more materials of the second active area.

10. A semiconductor structure comprising:
- a semiconductor substrate comprising first lower source/drain (S/D) regions and second lower S/D regions;
- a first replacement metal gate (RMG) structure upon the semiconductor substrate between the first lower S/D regions;
- a second RMG structure upon the semiconductor substrate between the second lower S/D regions;
- first raised S/D regions upon the first lower S/D regions adjacent to the first RMG structure;
- second raised S/D regions upon the second lower S/D regions adjacent to the second RMG structure;
- first area contact trenches within the first raised S/D regions;
- second area contact trenches within the second raised S/D regions;
- first self-aligned contacts within the first area contact trenches, and;
- second self-aligned contacts within the second area contact trenches.

11. The semiconductor structure of claim 10, wherein the first self-aligned contacts are metal-on-insulator (MIS) contacts and wherein the second self-aligned contacts are metal-silicide contacts.

* * * * *